US007518056B2

(12) United States Patent
Lechner

(10) Patent No.: US 7,518,056 B2
(45) Date of Patent: Apr. 14, 2009

(54) OPTIMISATION OF MIDI FILE REPRODUCTION

(75) Inventor: Thomas Lechner, Kirchheim (DE)

(73) Assignee: Sony Ericsson Mobile Communications AB, Lund (SE)

( * ) Notice: Subject to any disclaimer, the term of this patent is extended or adjusted under 35 U.S.C. 154(b) by 110 days.

(21) Appl. No.: 10/553,010

(22) PCT Filed: Feb. 23, 2004

(86) PCT No.: PCT/EP2004/001765

§ 371 (c)(1),
(2), (4) Date: Jun. 30, 2006

(87) PCT Pub. No.: WO2004/090862

PCT Pub. Date: Oct. 21, 2004

(65) Prior Publication Data

US 2006/0272487 A1 Dec. 7, 2006

(30) Foreign Application Priority Data

Apr. 8, 2003 (EP) ................................. 03008182

(51) Int. Cl.
*G10H 7/00* (2006.01)
*G10H 1/46* (2006.01)
*H03G 3/20* (2006.01)
*H03G 11/04* (2006.01)

(52) U.S. Cl. ............................ 84/645; 84/633; 381/55; 381/107

(58) Field of Classification Search .................. 84/633, 84/645, 665; 704/224, 225; 700/94; 381/94.1, 381/94.2, 98, 55, 107
See application file for complete search history.

(56) References Cited

U.S. PATENT DOCUMENTS

| | | | | |
|---|---|---|---|---|
| 5,138,926 | A | 8/1992 | Stier et al. | 84/615 |
| 5,852,251 | A | 12/1998 | Su et al. | 84/645 |
| 2002/0122559 | A1 * | 9/2002 | Fay et al. | 381/119 |
| 2003/0012361 | A1 | 1/2003 | Yoshimura | 379/373.01 |

OTHER PUBLICATIONS

Ketron SD1 Mastering Studio webpage. Feb. 16, 2003. <http://web.archive.org/web/20030216074423/http://www.soundcompany.net/sd1/mastering_studio/>.*

International Search Report dated May 25, 2004, corresponding to PCT Application No. PCT/EP2004/001765.

* cited by examiner

*Primary Examiner*—Walter Benson
*Assistant Examiner*—Andrew R Millikin
(74) *Attorney, Agent, or Firm*—Myers Bigel Sibley & Sajovec, P.A.

(57) ABSTRACT

A method for adapting a score stored in a MIDI file for being reproduced on a mobile terminal to the transfer function of an electroacoustic reproduction circuitry includes test rendering of the score to obtain sampled data prior to a reproduction of the score on the mobile terminal. From these sampled data, one or more values and or combination of values for a desired electroacoustic reproduction on the mobile terminals are identified, and, based on these identified values, one or more parameters suited for adapting the score with respect to the desired or optimised reproduction on the mobile terminal are determined.

12 Claims, 2 Drawing Sheets

OPTIMISATION OF MIDI FILE REPRODUCTION

RELATED APPLICATIONS

The present application is a 35 U.S.C. §371 national phase application of PCT International Application No. PCT/EP2004/001765, having an international filing date of Feb. 23, 2004, and claiming priority to European Patent Application No. 03008182.2, filed Apr. 8, 2003, the disclosures of which are incorporated herein by reference in their entireties. The above PCT International Application was published in the English language and has International Publication No. WO 2004/090862 A1.

BACKGROUND OF THE INVENTION

The present invention relates to mobile terminals adapted for reproducing sound or music files, respectively, particularly reproducing MIDI (Musical Instrument Digital Interface) data files.

MIDI is a data format, which does not contain sampled audio data like for instance ".wav"-files, but a specification on how the sound is to be rendered. A MIDI file can be regarded as a sheet of music in an electronic legible format. It contains information about the soundtrack and the devices being used and the acoustical parameters which have to be considered when reproducing the score represented by the data stored in the respective MIDI file. The collective term acoustical parameter denotes statements defining for instance the pitch, the note or rest values, respectively, the loudness level, the tempo, the timbre or special effects like vibrato or reverberation.

To turn a MIDI file into sound, the information present in the MIDI file has to be interpreted and formed to data representing a sampled, digital sound. Therefore, a so-called "MIDI synthesiser" is used, which renders the score of the MIDI file to sample data. like e.g. those used in a mono or stereo ".wav"-file. "The MIDI synthesiser may be implemented in software in a digital signal processor or in a separate dedicated hardware. The rendering of the score is usually based on so-called wave tables, which contain sound samples of an instrument, like e. g. of a piano, in form of digitally sampled data. On mobile terminals, like for instance mobile phones, PDAs (Personal Digital Assistants) or the like, pieces of music are preferably kept in store in form of MIDI files, as the size of MIDI files is extremely small compared to files containing sampled audio data. A PCM (Pulse Code Modulation) format audio file, like for example a ".wav"-file uses up to 10 Megabyte per minute of music while the same music can be stored in a MIDI file of less than 10 Kilobyte. This is possible like already mentioned above, as the MIDI file contains only the instructions needed by a MIDI synthesiser to reconstruct the respective sound and not the sound data itself.

On mobile terminals, MIDI files can be replayed for entertainment or be used as ringer or alarm signals to indicate incoming calls, received messages or other events.

The MIDI files can be sent and received by a mobile terminal in form of a SMS (Short Message Service) or MMS (Multimedia Messaging Service) type of message.

An electroacoustic reproduction circuitry of a mobile terminal allows the reproduction of the score stored in a MIDI file on the basis of the mono or stereo sampled data rendered from the score by the MIDI synthesiser. Depending on the characteristics of the electroacoustic reproduction circuitry, particularly the loudspeaker used, there are certain restrictions, like e.g. the frequency response, the dynamic range, and the maximum allowable amplitude of the sound signal which are to be considered when reproducing a score from a MIDI file. Although mainly the thresholds given by the respective restrictions are not to be exceeded without degrading the quality of the reproduced sound signal, many specific applications like ringer or alarm signals, require to reproduce a score close to the thresholds for obtaining the maximum possible output level.

As the sound signal rendered from a MIDI file depends on the algorithms and wavetables of the MIDI synthesiser used, critical values of the sampled data obtained when rendering the score, like for instance the maximum amplitude or maximum dynamic range, cannot be predicted from the data stored in a MIDI file directly. The <BR><BR><BR> volume and/or the dynamic range of as audio signal reproduced from a MIDI file are commonly adjusted by a dynamic compressor or limiter. These are signal processors implemented in software or hardware modifying the audio signal in the course of repreduction based on the current and past values, ignoring critical values <BR><BR><BR> like e. g. a peak @ amplitude occurring in the future of the playback. The consequence is a degraded fidelity of the sound reproduction due to the audible or annoying artefacts implemented.

SUMMARY OF THE INVENTION

It is therefore an object of the present invention to provide a method for adapting a score stored in a MIDI file for being reproduced on a mobile terminal in such a way, that the resulting sound signal is free of audible and annoying artefacts.

The above object is achieved by the invention as defined in the independent claims. Additional advantageous features of the present invention are claimed in the respective subclaims.

The above object is in particular achieved by a method for adapting a score stored in a MIDI file for being reproduced on a mobile terminal to the transfer function of an electroacoustic reproduction circuitry, comprising steps for test rendering the score to obtain sampled data prior to a reproduction of the score on the mobile terminal, identifying, from the sampled data, one or more values and/or one or more combinations of values which are important for a desired electroacoustic reproduction on the mobile terminal, and determining, based on the identified values, one or more parameters suited for adapting the score with respect to the desired (or optimised) reproduction on the mobile terminal. The desired reproduction typically is a predefined or optimised reproduction with optimised or desired sound quality depending on the respective use. Depending on the use case, e.g. maximum loudness disregarding sound quality or best use of available dynamic range without annoying distortion could be desired. In the first case, the maximum amplitude or maximum root mean square value of the rendered signal would be an important value, in the second case the dynamic range of the rendered signal would be an important value.

The object of the invention is further achieved by a computer software product comprising a series of state elements which are adapted to be processed by a data processing means of a mobile terminal such, that a method according to the present invention may be executed thereon.

The above object is further achieved with a mobile terminal, which is adapted to store and reproduce a score present in the format of a MIDI file, and which has a storage means for storing the MIDI file, a processing means for rendering sampled data from the MIDI file, a reproduction means for transforming the sampled data obtained from the MIDI file into a respective sound reproduction, and control means for adapting the score according to a method of the present invention.

The present invention advantageously separates the adaptation of the score to the properties of the electroacoustic reproduction circuitry on the mobile terminal from the actual reproduction of the score itself. It thus allows a level control based on the entire score, a condition indispensable for guaranteeing a reproduction of the score without artefacts.

In a preferred embodiment a gain factor is determined on test rendering the score by comparing the maximum absolute value identified in the sampled data with a limit value defined for the electroacoustic reproduction circuitry of the mobile terminal. The score may hereby advantageously be adapted by storing the gain factor determined within the MIDI file holding the respective score. By providing a gain factor, which sets the maximum amplitude to be expected from the score in relation to the dynamic range available on the mobile terminal, a general adaptation of the score to the properties of the electroacoustic reproduction circuitry is achieved.

Alternatively, the score may be adapted by normalising at least one volume setting of the score by the determined gain factor. The volume setting normalised, may hereby be a suited first volume value defining the volume of one or more devices and/or a second volume value, defining a modification of a first volume value for a certain period of time. By normalising a volume setting of the score, the respective score itself is prepared for an artefact flee reproduction by the electroacoustic reproduction circuitry of the mobile terminal. As the volume setting may be defined as a master volume affecting all devices or channels, respectively, defined in the score or only one or a part thereof, an adaptation of a respective first volume value allows an overall adaptation and/or an individual adaptation of certain devices to the transfer function of the electroacoustic circuit. A modification of a second volume value provided in the score for modifying one or more of the first volume values for a certain period of time enables a modification of crescendos or decrescendos according to the specification of the electroacoustic reproduction circuitry.

The gain factor determined may further be stored separately to the MIDI file holding the score such leaving the score unaltered with the option of adapting it properly in the course of an actual reproduction on the mobile terminal.

In a further preferred embodiment of the present invention, the adaptation of the score includes steps for reducing the dynamic range of the sampled data rendered therefrom for one or more sections of the score and on the basis of a determination of volume level changes in the respective one or more sections of the score. This is particularly useful when reproducing a classic piece of music or passages with extremely low sound levels alternating with levels of extremely high sound levels. As the acoustic volume on mobile phones is typically low compared to high fidelity sound systems, the steps in the sound levels have to be reduced for improving the fidelity of the sound reproduction.

If a score contains only a few amplitudes, which values are far above the average, the score would be reproduced at a very low sound level. The rendering of the score for obtaining sample data therefore advantageously comprises a limiting step for reducing the crest factor associated with the peak amplitudes of the sampled data rendered.

An adaptation of the score is effectively performed prior to storing a respective MIDI file on the mobile terminal insuring that all stored MIDI files are in a condition for immediate reproduction by the electroacoustic circuitry of the mobile terminal.

The adaptation of the score may be suitably performed in the course of arranging the score on the mobile terminal itself or separate to it, enabling to fit the score according to the specifications set by the electroacoustical production circuitry of the mobile terminal.

A mobile terminal according to the present invention may further be equipped with a limiting means for reducing the crest factor of sampled data rendered from an adapted score during reproduction. This allows to disregard isolated peak amplitudes of the piece of music when rendering the score with respect to keep the sound level at a certain average value. As only a few and isolated peak amplitudes have to be considered, a conventional or a dynamic compressor may be used for implementing the limiting means.

BRIEF DESCRIPTION OF THE DRAWINGS

In the following description, the present invention is explained in more detail with respect to special embodiments and in relation to the enclosed drawings, in which.

DETAILED DESCRIPTION OF EMBODIMENTS

Figure 1:
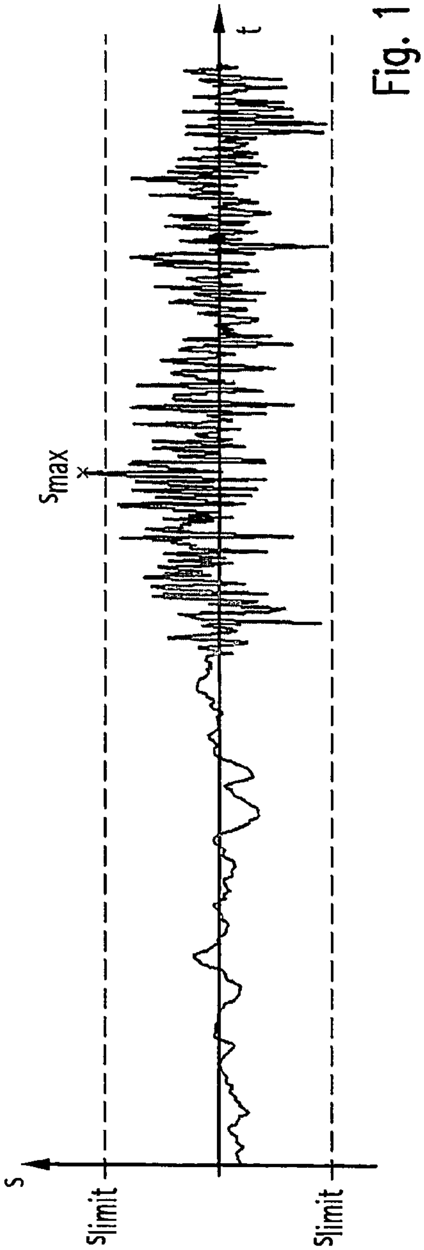
FIG. 1 shows an example of sampled data obtained from rendering a score present in a MIDI file.
Figure 2:
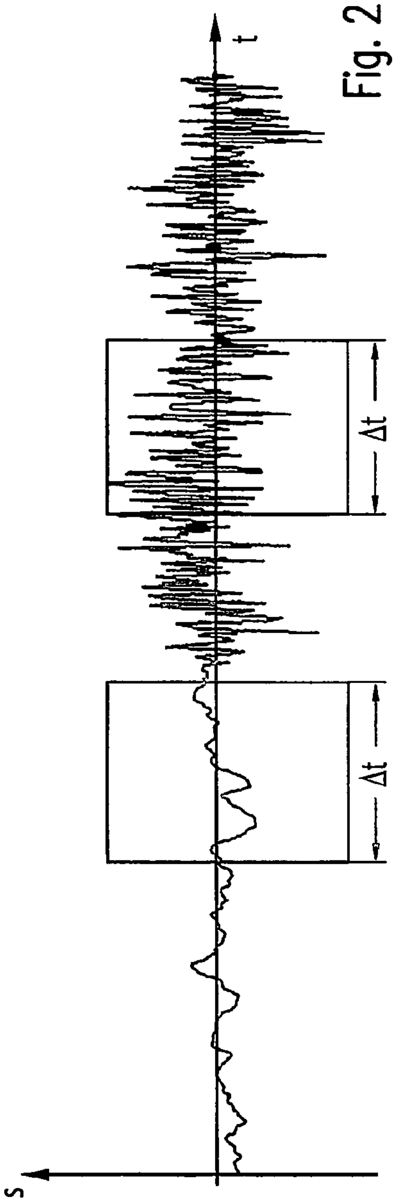
FIG. 2 shows the sampled data of FIG. 1 with trio time windows for calculating an average amplitude.

A MIDI file contains the instructions which are necessary to reproduce a certain piece of music or sound. The information stored in the file does not represent audio data directly, but programming instructions, which enable a MIDI synthesiser to generate the respective sound. The data format of MIDI files has been standardised by the MIDI Manufacturers Association (MMA), an Association to which many of the most important manufacturers of digital music instruments belong to. The standard defines the format of the so-called MIDI protocol, in which each instruction is formed by a sled MIDI word. Regularly, a MIDI word is formed by 3 Bytes, the first of which is the Status Byte carrying the information about which type of message the MIDI word represents. The Status Byte is followed by two Data Bytes carrying the content information of the message. Actually, the Status Byte carries two pieces of information. The first four bits represent the message type, the second four bits the number of the device or MIDI channel, respectively, to which the information belongs to.

The control of MIDI functions by means of parameterised control signals is accomplished using called MIDI controllers. With the first Data Bytes of the MIDI word, a maximum of 128 different controller addresses, corresponding to about 128 different input devices or other MIDI functions, can be addressed.

The second Data Byte is reserved for the value, that the controller is to be set to. MIDI controller messages are used to implement various effects by musicians while playing an instrument with a MIDI interface. To give an example, controller no. 68, which is reserved for the function “legato pedal” will cause a legato effect between notes, which is usually achieved by skipping the attacked portion of the VCA’s envelope. This controller allows a keyboard player to better simulate a phrasing of wind and brass players, who often play several notes with single tonguing, or simulate guitar pull-offs and hammer-ons.

The defined controllers, of which is made use in the present invention, are controller no. 7 named “volume” ad controller no. 11 named "expression". The controller "volume" affects a device' main volume level. In case of a multitimbral synthesiser, an instrument with the ability to play two or more different sounds at the same time, the volume is set for each put of the device separately. In other words, the controller "volume" can be set differently on each of the 16 channels of a MIDI device. The control "expression" defines a percentage of a "volume" setting. While the "volume" controller is used to adapt the overall volume of an entire part of a piece of music, "expression" is used for implementing crescendos in decrescendos. When "expression" is at 100 percent, then the volume represents the true setting of the "volume" controller, and when expression is set to 0 percent, the "volume" is off. To control the overall volume of a reproduction, a so-called "master volume" may be defined, which allows the control of al individual volume settings simultaneously.

For reproducing a piece of music, from the information stored in a MIDI file in form of a score a MIDI synthesiser is used which generates sampled data, forming the base for a subsequent sound generation with an electroacoustic reproduction circuitry. The process of transforming a score stored in a MIDI file into respective sample data is called rendering. The sampled data obtained from rendering a MIDI file may further also be referred to as rendered data. In FIG. 1, the sampled data reproduced from a score stored in a MIDI file are shown for a short period of time. The values of the rendered data change relative to the intended elongation of the electroacoustic transducer used to produce a respective sound from that data. To ensure a high fidelity reproduction of the score, the values of the rendered data must not exceed a limiting value, which corresponds to the maximum possible elongation of the electroacoustic transducer used and/or the proportional range of the electroacoustic reproduction circuitry. The proportional range of the electroacoustical reproduction circuitry is defined by the rendered data supplied to the electroacoustical circuitry producing a corresponding sound pressure. As the values of the sampled data are a result of interpreting the data of the score with wavetables, the MIDI file itself can be browsed for identifying the maximum value of the sampled data rendered therefrom. If the maximum volume exceeds the limiting value the respective piece of music will be produced with audible artefacts.

To avoid a corresponding poor reproduction of a score, the present invention applies a test rendering to the score prior to its reproduction with the electroacoustic reproduction circuitry of the mobile terminal. The reproduction of a score is typically done by rendering the MIDI file with a MIDI synthesiser, followed by converting the obtained sampled data with a D/A (digital to analogue) converter, and amplifying the obtained analogue audio signal by a preamplifier supplying the amplifier audio signal to an electroacoustic transducer, like e.g. a loudspeaker, which converts the electric signal into a respective sound wave. The electronic circuitry comprising the D/A converter, the amplifier and the transducer, together form the electoacoustic reproduction circuitry. The MIDI synthesiser in combination with the electroacoustic reproduction circuitry as usually referred to is the reproduction chain.

Preferably, a test rendering of the sampled data is performed during periods when the electroacoustical reproduction circuitry is suspended, so that the data obtained can be analysed by a logic circuitry in the background, independent of a playback of the score stored in the MIDI file.

In a first embodiment of the present invention, the logic circuitry browses the rendered data for identifying the maximum value present in that data. As the sampled data from positive and negative values around a zero line, the identification of the maximum value is based on the absolute values of the sampled data and not on the original values. By comparing the identified maximum value with the limiting value defined according to the respective electroacoustic reproduction circuitry used, the logic circuitry defines a gain factor, which is given by the quotient of the limiting value to the maximum value identified. When multiplying all sampled data obtained from the score with the gain factor, there will be no value higher than the limiting value.

As the gain factor obtained is only valid for the particular MIDI file investigated, it has to be stored in a way, that its relation to the score is maintained. Preferably, the gain factor is stored within the MIDI file holding the corresponding score. This can be accomplished in many different ways. The easiest way is to store the gain factor in form of a controller which is known to the MIDI synthesiser used. The MIDI standard knows several undefined and general purpose type of controllers which may be used to this respect. The MIDI synthesiser used will have to be adapted to interpret the newly defined controller in the way intended, and to interpret the values stored along with the controller number as the gain factor to be applied. On rendering the score, the MIDI synthesiser will then weight all rendered values with the gain factor read from the respective controller.

When using a non-modified MIDI synthesiser, the gain factor calculated on test rendering is preferable used to modify the settings of the controllers affecting the volume of the sampled data when rendered. Before adapting the overall volume of the score, preferably the value of the "master volume" setting is multiplied with tee gain factor calculated before. But of course, it is also possible to adapt the values of the volume controller messages corresponding to a "volume" or "expression" controller.

Modifying the "master volume" setting according to a gain factor calculated on the basis of the maximum occurring amplitude $s_{max}$ shown in FIG. 1, is the preferred method for scores with more or less constant sound level. But many scores, particularly classical ones show a big variation in the sound level from section to section which leads to the low level passages being inaudible when being listened to on a mobile terminal. It is therefore advisable to reduce the dynamic range between the low level passages and the high level passages of a respective score so that the ratio of the level changes will not exceed a certain value.

To this respect, the power density associated with the sampled data is monitored within a time window of length $\Delta t$, which is moved through the sample data obtained from rendering the score. When there is a change in the average sound level from one passage of the score to the next, the power density calculated from the moving window will change its value. When the change exceeds a certain value defined for the electroacoustic reproduction circuitry of the mobile terminal, the score has to be adapted in order to reduce the sound level changes found. This is effectively done by modifying the value of the "expression" controller. In other words, a crescendo may be applied to the low volume passages and/or a decrescendo to the high level passages. Such, the score can be adapted to use the full dynamic range of the electroacoustic circuitry thus guaranteeing the audibility of the low volume passages even in a noisy environment.

Preferably, the "master volume" controller is used as the first setting to adapt the maximum values of the sample data to the maximum ratings of the electroacoustic reproduction circuitry while the "expression" controller is used to raise the levels of the low volume passages of the score. Different music instruments or MIDI channels, respectively, contribute in different ways to the experience imparted when listening to a respective piece of music. While for example percussion instruments are usually used for a rhythmic background, other instruments like a piano or a violin contribute the theme of the arrangement and have therefore to be treated with priority. A test rendering of the MIDI file may therefore suitably be performed on the different MIDI channels separately, and an adaptation of the volume settings may be made such, that the overall sound level will not exceed the limit value set by the electroacoustic reproduction circuitry with the higher priority MIDI channels being emphasize relative to the lower priority MIDI channels. This can be accomplished by multiplying the value for each volume control of a MIDI channel with the gain factor and further with a weight factor corresponding to the priority of the respective MIDI channel.

Some scores show peak levels, which are short enough in duration for not raising the average sound level in their close vicinity. Cutting the crest factor of these peak amplitudes will not cause any audible or annoying artefacts, as their duration is too short to be noticed by a listener. For reducing the crest factor of a respective peak amplitude, the sampled data rendered from a score will be subject to a limiting step implemented either by a dynamic compressor or limiter. It may be accomplished in software processing of the sampled data just before the digital-to-analogue conversion, or by hardware integrated in the amplifying stage.

What has been described up to now is based on the assumption, that the MIDI file already exists and has to be adapted according to the properties of the electroacoustic reproduction circuitry on the mobile terminal. Many mobile terminals offer to compose a piece of music directly on the mobile terminal itself. In a further embodiment of the present invention, the adaptation of the score to the property of the electroacoustic reproduction circuitry is therefore performed in the course of arranging the score. As the process of composing is usually very slow as compared to the process of rendering the score, the score may be rendered continuously in the background for being analysed by the logic circuitry of the mobile terminal for the parameters needed to continuously adapt the already existing part of the score just being composed to the properties of the electroacoustic reproduction circuitry.

Many mobile terminals are equipped with interfaces allowing to access the internet or to exchange data with other devices which allows to download a MIDI file from an external resource. In a preferred embodiment of the present invention, such a downloaded MIDI file will be adapted prior to storing the file on the mobile terminal. Alternatively, the mobile terminal may send identification data or technical specifications relevant for the adaptation of the MIDI score to the external resource allowing to adapt the score on the external resource prior to the download.

On different types of mobile terminals, one and the same score will have to be adapted in different ways to ensure an optimal reproduction. If users of different mobile terminals intend to exchange a score, the adaptation of the score on the receiving terminal would have to be done on the basis of the adapted score of the sending terminal. Repeatedly adapting a score may render the underlying piece of music unrecognizable. Therefore, it may be advisable to beep the MIDI file unmodified but to store the data necessary for adapting the score on reproduction in a separate location of the mobile terminal. The adaptation parameters obtained from the test rendering are then used from the MIDI synthesiser when rendering the score for being replayed on the mobile terminal. Alternatively, a MIDI file may be stored modified as described above and additionally, the adaptation parameters obtained from the test rendering are stored separate to the MIDI file on a different location of the mobile terminal. These parameters are then used when sending the MIDI file to an external resource for restoring the original score from the MIDI file.

All particular embodiments of the method for adapting a score described above are advantageously implemented as software on a mobile terminal. The corresponding software may be provided in form of a computer software product, e.g. in form of a file which can be sent to the mobile terminal by SMS or MMS or be downloaded to the mobile terminal from an internet resource or a data carrier like for instance a Subscriber Identity Module.

Figure 3:
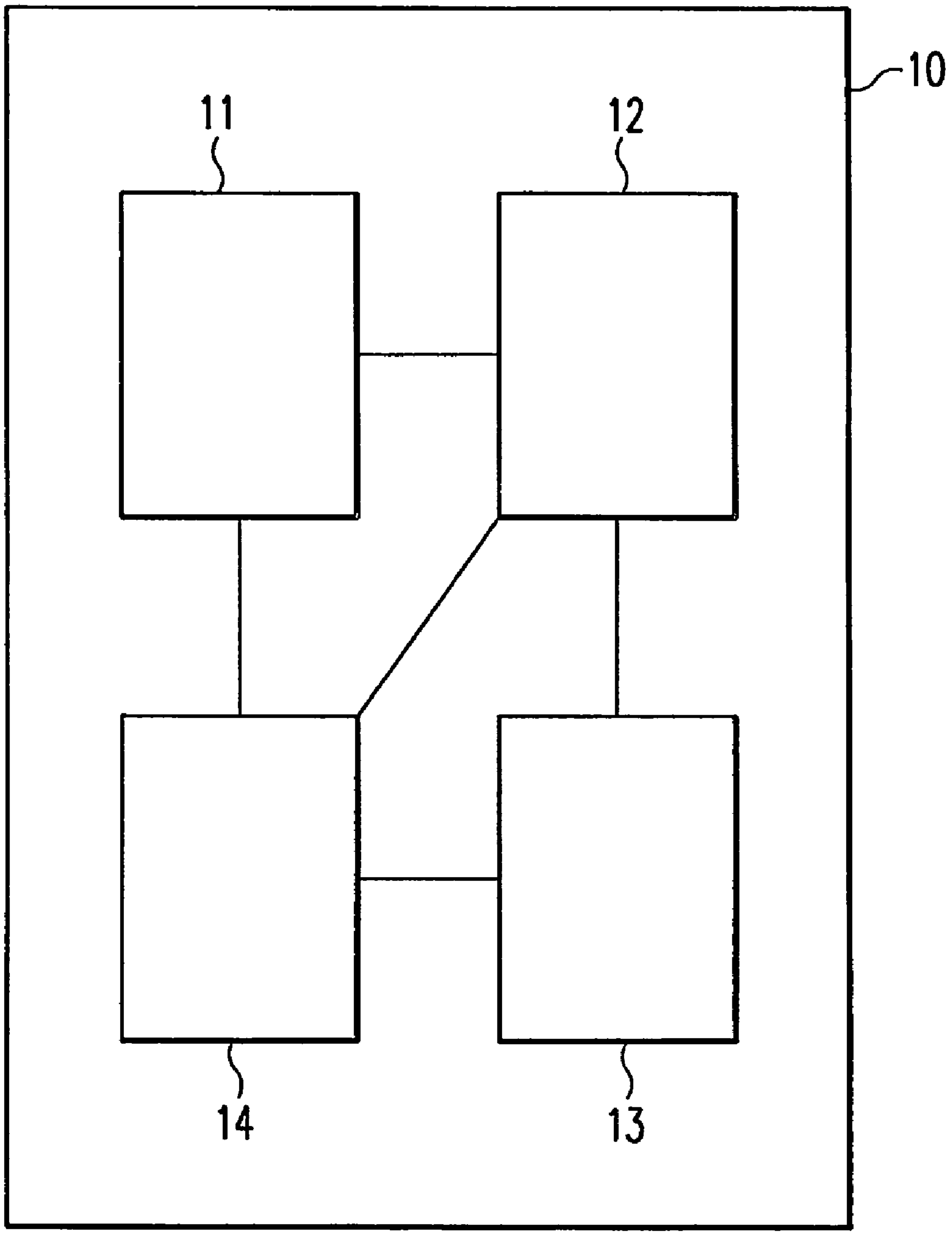
FIG. 3 shows a schematic representation of a mobile terminal according to the present invention.

A schematic representation of a mobile terminal according to the present invention is shown in FIG. 3. The mobile terminal 10 comprises a storage means 11 suited for storing a MIDI file, a processing means 12 for rendering the MIDI file to obtain sampled data, a reproduction means 13 for transforming the sampled data obtained from the MIDI file into a respective sound reproduction, and a control means 14 for adapting the score in one or more of the above-described ways. A limiting means may either be implemented in form of software in the control means or in form of hardware in the reproduction means 13. The limiting means may be formed by a dynamic compressor reducing the crest factor of the sampled data rendered.

The invention claimed is:

1. A method for adapting a score stored in a MIDI file for being reproduced in a mobile terminal to the transfer function of electroacoustic reproduction circuitry, comprising:

rendering the score stored in the MIDI file to obtain sampled data prior to a reproduction of the score on the mobile terminal, comprising:

determining a gain factor from a comparison of an identified maximum absolute value of the sampled data with a limit value defined for the electroacoustic reproduction circuitry;

identifying, from the sampled data, one or more values or one or more combinations of values which are evaluated based on a desired electroacoustic reproduction on the mobile terminal; and determining, based on the identified values, one or more parameters suited for adapting the score with respect to the desired reproduction on the mobile terminal; and storing the gain factor determined within the MIDI file holding the score.

2. A method according to claim 1, further comprising:

normalising at least one volume setting of the score with the gain factor.

3. A method according to claim 2, wherein the at least one volume setting of the score is a first volume value defining the volume of one or more devices or a second volume value defining a modification of a first volume value for a certain period of time.

4. A method according to claim 1, wherein the gain factor is stored separately from the MIDI file containing the score.

5. A method according to claim 1, further comprising:

reducing the dynamic range of the sampled data rendered therefrom for one or more passages of the score on the basis of a determination of volume level changes in the respective one or more passages of the score.

6. A method according to claim 1, wherein test rendering the score comprises reducing a crest factor of the sampled data.

7. A method according to claim 1, wherein rendering the score, identifying, from the sampled data one or more values, and determining, based on the identified values, one or more parameters are performed prior to storing a MIDI file containing the score on the mobile terminal.

8. A method according to claim 1, wherein rendering the score, identifying, from the sampled data one or more values, and determining, based on the identified values, one or more parameters are performed in the course of arranging the score.

9. A computer program product comprising a computer readable storage medium having computer readable program code embodied therein, the computer readable program code being configured to carry out the method of claim 1.

10. A mobile terminal adapted to store and reproduce a score in the format of a MIDI file, comprising:

electroacoustic reproduction circuitry;

storage means for storing the MIDI file;

processing means for rendering sampled data from the MIDI file, the processing means being configured to determine a gain factor from a comparison of an identified maximum absolute value of the sampled data with a limit value defined for the electroacoustic reproduction circuitry;

reproduction means for transforming the sampled data obtained from the MIDI file into respective sound reproduction; and control means for adapting the score, the control means comprising:

means for identifying, from the sampled data, one or more values or one or more combinations of values which are evaluated based on a desired electroacoustic reproduction on the mobile terminal; and means for determining, based on the identified values, one or more parameters suited for adapting the score with respect to the desired reproduction on the mobile terminal;

wherein said score is adapted to a transfer function of the electroacoustic reproduction circuitry.

11. A mobile terminal according to claim 10, further comprising:

means for reducing a crest factor of sampled data of an adapted score when being reproduced.

12. A mobile terminal according to claim 11, wherein the means for reducing comprises a dynamic compressor.

* * * * *